United States Patent
Ishigaki

(10) Patent No.: US 10,381,497 B2
(45) Date of Patent: Aug. 13, 2019

(54) ELECTRIC POWER TRANSFER SYSTEM USING OPTICAL POWER TRANSFER

(71) Applicant: TOYOTA MOTOR ENGINEERING & MANUFACTURING NORTH AMERICA, INC., Erlanger, KY (US)

(72) Inventor: Masanori Ishigaki, Ann Arbor, MI (US)

(73) Assignee: TOYOTA MOTOR ENGINEERING & MANUFACTURING NORTH AMERICA, INC., Erlanger, KY (US)

( * ) Notice: Subject to any disclaimer, the term of this patent is extended or adjusted under 35 U.S.C. 154(b) by 0 days.

(21) Appl. No.: 15/863,091

(22) Filed: Jan. 5, 2018

(65) Prior Publication Data

US 2018/0130916 A1     May 10, 2018

Related U.S. Application Data

(62) Division of application No. 14/824,643, filed on Aug. 12, 2015, now Pat. No. 9,899,550.

(51) Int. Cl.
*H05K 7/14*     (2006.01)
*H01L 31/0352*  (2006.01)
(Continued)

(52) U.S. Cl.
CPC .. *H01L 31/035281* (2013.01); *H01L 31/0504* (2013.01); *H01L 31/054* (2014.12);
(Continued)

(58) Field of Classification Search
CPC ....... Y02E 10/50; Y02E 10/52; H01L 31/055; H01L 31/056
See application file for complete search history.

(56) References Cited

U.S. PATENT DOCUMENTS 3,912,931 A    10/1975 Gravisse et al.
5,376,185 A    12/1994 Wanlass
(Continued)

FOREIGN PATENT DOCUMENTS

DE    27 37 847 A1    3/1979
JP    60-74685        4/1985
(Continued)

OTHER PUBLICATIONS

Schubert, et al., "High-Voltage GaAs Photovoltaic Laser Power Converters", IEEE Transactions on Electron Devices, vol. 56, No. 2, Feb. 2009, pp. 170-175.

*Primary Examiner* — Sibin Chen
(74) *Attorney, Agent, or Firm* — Oblon, McClelland, Maier & Neustadt, L.L.P.

(57) ABSTRACT

An apparatus and method for optical-power-transfer (OPT). A light source converts electrical energy into light, and the light is transmitted from the active layer of the light source directly to the active layers of a series of photovoltaic (PV) devices without first passing through a conduction layer of the PV device. Thus, absorption in the conduction layer is avoided, and the efficiency of the OPT system is improved. The PV devices are configured to each generate equal current, and the PV devices are electrically connected in series. PV devices are arranged in series with light first propagating through PV devices closer to the light source, and farther PV devices having a longer propagation length, such that the light absorbed and current generated by each PV device is equal to the other PV devices. In one implementation, the PV devices are configured in a laser cavity with the light source.

15 Claims, 15 Drawing Sheets

(51) Int. Cl.
  *H01L 31/05* (2014.01)
  *H02J 1/00* (2006.01)
  *H01L 31/054* (2014.01)
  *H01S 5/40* (2006.01)
  *H01S 3/106* (2006.01)

(52) U.S. Cl.
  CPC ........ *H01L 31/0547* (2014.12); *H01S 5/4062* (2013.01); *H02J 1/00* (2013.01); *H01S 3/1061* (2013.01); *Y02E 10/52* (2013.01)

(56) References Cited

U.S. PATENT DOCUMENTS

| | | |
|---|---|---|
| 6,316,715 B1 | 11/2001 | King et al. |
| 7,358,512 B1 | 4/2008 | Lordi |
| 2003/0211479 A1 | 11/2003 | Howard |
| 2006/0162768 A1 | 7/2006 | Wanlass et al. |
| 2007/0126073 A1 | 6/2007 | Shiu et al. |
| 2009/0056791 A1* | 3/2009 | Pfenninger ........... H01L 31/055 136/247 |
| 2010/0278212 A1 | 11/2010 | Burghartz et al. |
| 2013/0119409 A1 | 5/2013 | Zhao |
| 2016/0099266 A1 | 4/2016 | Zheng et al. |

FOREIGN PATENT DOCUMENTS

| | | |
|---|---|---|
| JP | 2005-302819 | 10/2005 |
| JP | 2006-216562 | 8/2006 |
| JP | 2012-529760 | 11/2012 |
| WO | WO 2010/142626 A2 | 12/2010 |

* cited by examiner

ELECTRIC POWER TRANSFER SYSTEM USING OPTICAL POWER TRANSFER

CROSS-REFERENCE TO RELATION APPLICATIONS

This application is a divisional of U.S. application Ser. No. 14/824,643, filed Aug. 12, 2015, the entire contents of which are incorporated herein by reference.

BACKGROUND

Field

Embodiments described herein relate generally to a device for transferring electrical power using light to achieve electrical isolation between a powered circuit and a powering circuit that provides power to the powered circuit, and, more particularly, to an optical power transfer (OPT) device transmitting light to multiple photovoltaic (PV) devices that are electrically connected in series, and the multiple photovoltaic (PV) devices are arranged such that the light propagates through the depletion regions of the PV devices without first propagating through the conduction region (e.g., the p-doped or n-doped regions adjacent to the depletion regions) of the PV devices.

Description of the Related Art

Optical power transfer (OPT), also referred to photonic power, has several advantages over electrical power transfer systems. First, OPT provides electrical isolation between a circuit that supplies power (i.e., the powering circuit) and a power consuming circuit (i.e. the powered circuit). Second, OPT can be used to transfer power via optical fiber or free space propagation into remote or inaccessible environments (e.g., into oil wells or outer space) or into environments were electrical power transfer would be dangerous (e.g., environments where a spark could initiate an explosion or were electrical power transfer increases risks due to creating conduction paths to the sensitive components during a lighting strike). The method and apparatus discussed herein focus primarily on the first advantage of avoiding noise from ground loops and avoiding electromagnetic interference (EMI).

In OPT, an optical source converts, at a first location, electrical energy into optical energy, and transmits the optical energy to a second location. At the second location, the optical energy has propagated from the optical source to a photovoltaic (PV) cell that converts the light back into electrical energy. OPT is similar to optical isolators that can also be used to interrupt ground loops and minimize EMI while enabling signals to be sent between two electrically isolated circuits. Unlike general optical-isolation circuits (e.g., photo-couplers) for which energy consumption and efficiency can be secondary or even tertiary significance, OPT systems are primarily concerned with energy transfer, and therefore efficiency of the energy transfer processes is of primary importance. Generally, conventional OPT systems can be bulky and can have suboptimal efficiency.

SUMMARY

Accordingly, one object of the present disclosure is to provide an improved OPT system which will be smaller and more efficient than conventional OPT systems.

To that end among others, the present disclosure provides an OPT apparatus, including (i) a light source configured to convert electrical energy into light; and (ii) a plurality of photovoltaic device, each having an active layer interposed between a first conduction layer and a second conduction layer, the active layer arranged relative to the light source to receive the light from the light source without the light propagating through either the first conduction layer or second conduction layer, and converting the light received in the active layer into electrical energy, wherein (iii) the plurality of photovoltaic devices are electrically connected in series.

In another exemplary embodiment, the present disclosure provides an OPT apparatus, including (i) a first optical resonator; (ii) a first light source configured to convert electrical energy to light, the first light source including an active layer arranged to overlap an optical mode of the first optical resonator; and (iii) a first photovoltaic device including an active layer arranged to overlap an optical mode of the first optical resonator and configured to convert light to electrical energy, wherein (iv) the first optical resonator is configured to lase when a round-trip gain including gain from the gain active layer of the first light source is greater than a round-trip loss including absorption by the active layer of the first photovoltaic device.

It is to be understood that both the foregoing general description of the invention and the following detailed description are exemplary, but are not restrictive, of the claimed invention.

BRIEF DESCRIPTION OF THE DRAWINGS

A more complete understanding of this disclosure is provided by reference to the following detailed description when considered in connection with the accompanying drawings, wherein.

DETAILED DESCRIPTION

An aspect of the disclosure is providing a smaller more efficient optical power transfer (OPT) system in order to provide an electrically isolated power supply that is capable of operating in a strong electromagnetic interference (EMI) environment. OPT offers many benefits, including: transferring power to remote locations, improved safety, mitigation of ground loops, and reduction of the EMI. Some applications of OPT emphasize certain of these benefits while deemphasizing others. For example, free-space OPT from a ground laser to a satellite emphasizes the ability to transfer energy to remote locations. In another example, using OPT to transfer power into volatile and explosive environments, such as a grain silo containing fine grain dust that could be ignited by an electrical spark, emphasizes the safety aspects of OPT. Both of these examples use bulky and possibly expensive free-space or fiber optics in the OPT process in order to achieve additional goals in addition to electrical isolation between the powering circuit and the powered circuit. In applications emphasizing the electrical isolation and the minimization of noise coupling between circuits, OPT can be performed without the use of bulky and/or expensive optics. Furthermore, removing the bulky expensive optics and bringing the light source and photovoltaic (PV) device into closer proximity can have the additional benefit of improving efficiency by decreasing scattering a absorption losses of the light.

The OPT device/system described herein provides a configuration of the light source and PV device that improves efficiency and decreases the device size by bringing the light source and photovoltaic (PV) device into close proximity. Such a device could be useful, for example, in the EMI environment of an electric car to reduce EMI in sensitive control and measurement circuits to minimize errors in these sensitive circuits.

Figure 1A:
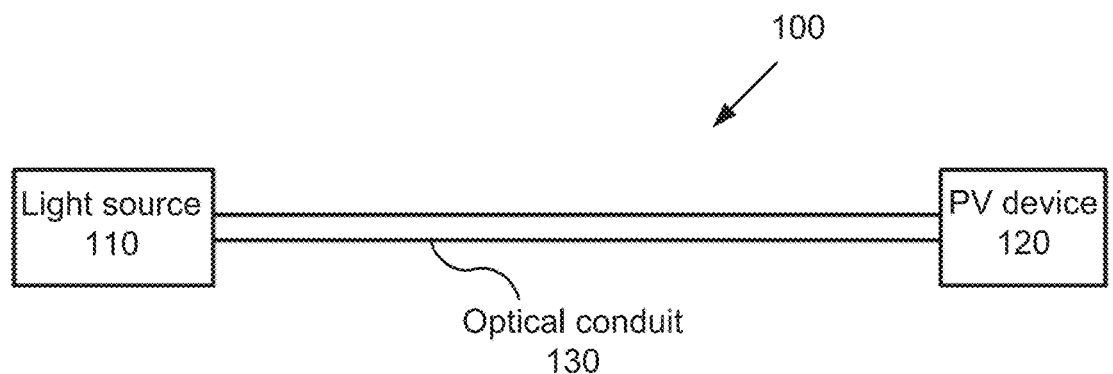
FIG. 1A shows a drawing of one implementation of an OPT system.

Referring now to the drawings, wherein like reference numerals designate identical or corresponding parts throughout the several views, FIG. 1A shows a general OPT system 100 having a light source 110, an optical conduit 130, and a PV device 120. The light source 110 converts electrical energy into light. For example, the light source 110 can be a monochromatic source (e.g., a semiconductor device, such as a light emitting diode (LED) or a laser diode (LD)). The light from the light source 110 is coupled into an optical conduit 130 (e.g., an optical fiber, waveguide, or even a free-space propagation channel).

After propagating through the optical conduit 130 the light is converted into an electrical signal by directing the light onto a PV device 120. The PV device 120 absorbs photons generating electron-hole pairs within a depletion region of a PN junction, for example. The voltage potential across the depletion region causes the respective charge carriers to separate to corresponding n-doped and n-doped regions on the two sides of the PN-junction. Thus, the electron-hole pairs are prevented from recombining, and the electrons and holes are collected in the n-doped and p-doped regions of the PN junction respectively. The voltage difference between the p-doped and n-doped regions is determined by the band gap of the semiconductor. Thus, the incident photons are converted into electrical power.

Figure 1B:
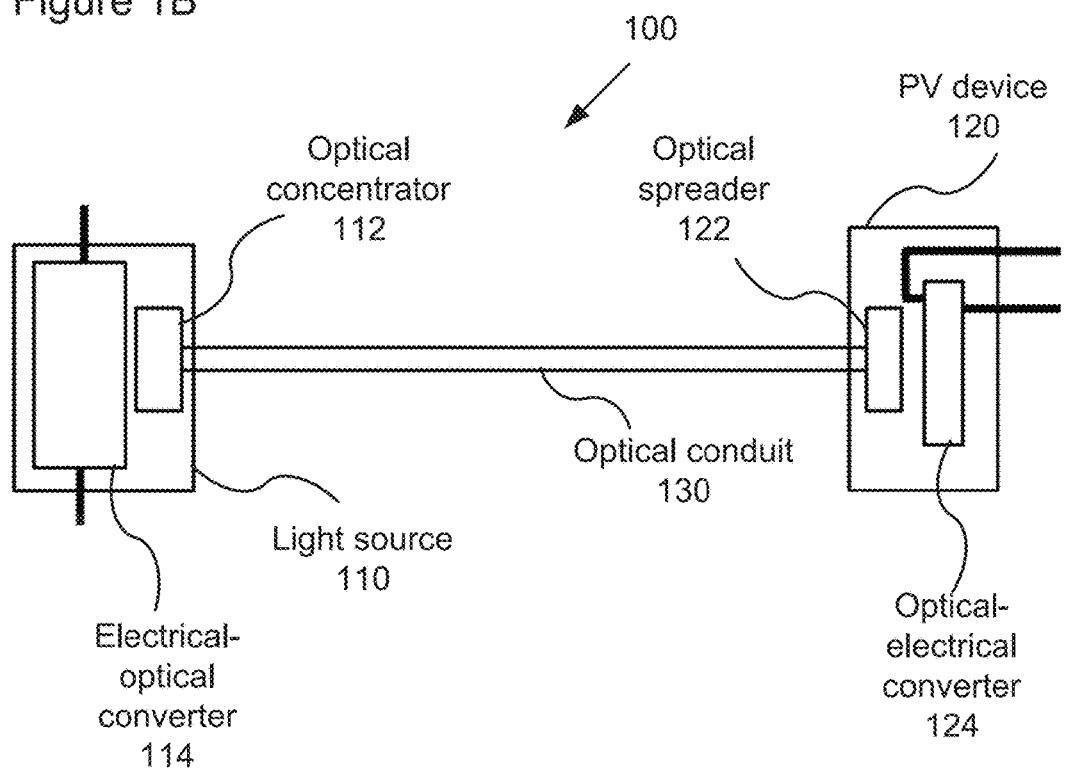
FIG. 1B shows a drawing of one implementation of an OPT system using an optical concentrator and an optical spreader.

As shown in FIG. 1B, in one implementation, the light source 110 can include an electro-optical converter 114, such as a semiconductor LD or a vertical cavity surface emitting laser (VCSEL), for example. The light source 110 further includes an optical concentrator 112 that can be, for example, a lens held in a fixed position relative to an FC, SMA, or other fiber-optic connector. The optical concentrator 112 connects to a first end of a fiber optic cable that is the optical conduit 130. The optical concentrator 112 focuses the light from the electro-optical converter 114 onto the core of the fiber to match the modes of the fiber optic cable. For example, the focused beam of the electro-optical converter 114 can approximate a Gaussian beam, and the optical conduit 130 can be a multi-mode optical fiber. At a second end of the optical conduit 130, the fiber optic cable connects to an optical spreader 122. For example, the optical spreader 122 can include another fiber connector (e.g. a second FC, SMA or other fiber optic connector) connected to another lens assembly that collimates the divergent light exiting the fiber optic cable. The light from the collimating optics are then directed onto one or more PV cells. These PV cells are part of the optical-electrical converter 124. The electricity generated by the optical-electrical converter 124 is then coupled to devices powered by the OPT system 100.

While the ability to transfer power remotely using a fiber conduit is beneficial for many applications, in other applications, the OPT system is used primarily for electrical isolation to mitigate the effects of ground loops and to reduce EMI coupled into noise sensitive circuits. In these cases the optical fiber and accompanying connectors and optics add unnecessary bulk, complexity, and optical loses to the OPT system. In these cases, there are considerable benefits to collocating the light source 110 and the PV device 120, and essentially eliminating the optical conduit 130.

Figure 2A:
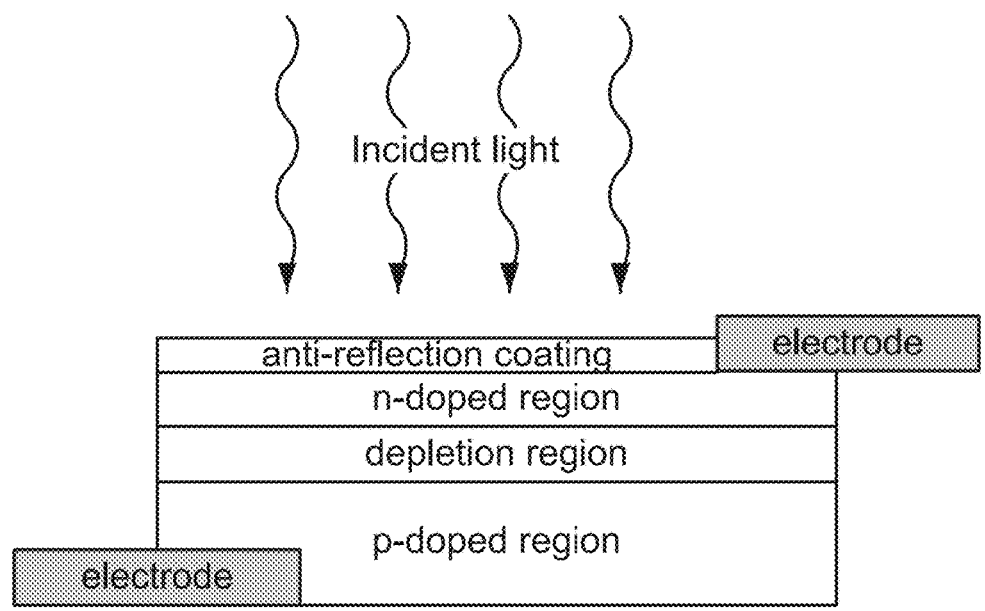
FIG. 2A shows a drawing of one implementation of a PV device in which light enters the depletion region after having propagated through one of the conduction regions (e.g., the n-doped region)

Further, the efficiency of an OPT system 100 can be improved by using side coupling into the PN junctions of the PV devices, rather than the more conventional end coupling conventionally used in solar PV devices. Solar PV devices are configured in a planar geometry on the surface of a substrate, such that light must first pass through one of the p-doped region or the n-doped region before reaching the active layer at depletion region, which is at the junction between the p-doped and n-doped regions, as shown in FIG. 2A. These PV devices are configured to have light enter through the top surface of the planar stack of doped regions. Sometimes an antireflection is included on top of the uppermost semiconductor layer to reduce scattering losses due to Fresnel reflections.

This geometry is advantageous for solar PV devices fabricated using modern microfabrication methods because the PV devices can be made to have large areas in order to capture a large amount of sunlight. However, these PV devices are also inefficient because photons absorbed in this uppermost conduction layer (e.g., the p-doped region in FIG. 2A) do not contribute to the current (e.g., electron-hole pairs in the uppermost conduction region recombine rather than contributing to the current, whereas electron-hole pairs generated in the depletion region contribute to the current because they are separated before recombination). The number of photons absorbed in the uppermost conduction layer could be reduced by making this layer thinner, but thinning this layer increases the ohmic losses due to increased resistance to electrical current flow from the PN-junction. Thus, there is a trade-off between increasing optical loss when the uppermost layer is thick and increasing electrical loss when the uppermost layer is thin, making the PV device configuration shown in FIG. 2A unavoidably lossy.

Figure 2B:
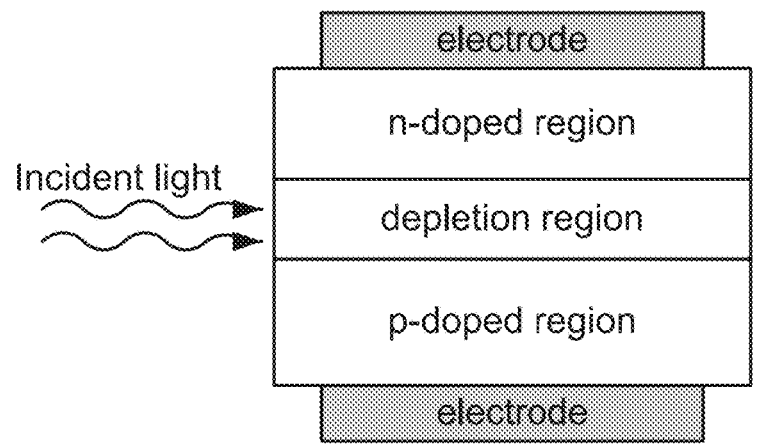
FIG. 2B shows a drawing of one implementation of a PV device in which light enters the depletion region directly.

In contrast to FIG. 2A, FIG. 2B shows a side incidence configuration in which light propagates in a direction substantially orthogonal to the stacking direction of the n- and p-doped regions and active layer. The light is directly incident on the depletion region, without first passing through an n-doped or p-doped conduction region. When the light propagates substantially orthogonal to the stacking direction (e.g., the divergence angle of the light is sufficiently small that most of the rays incident on the depletion remain in the depletion region while propagating through the PV device), then light incident on the depletion region is more likely to either be absorbed in the depletion region generating a photoelectric current or pass through the depletion region unabsorbed, rather than being absorbed in one of the n- or p-doped conduction layers without contributing to the photoelectric current. In this configuration the loss due to absorption through the uppermost conduction region can be avoided and the thickness of the uppermost semiconductor layer can be increased to reduce ohmic losses. Whereas the configuration shown in FIG. 2B might be poorly optimized for solar radiation harvesting, if the PV device and the light source are integrally fabricated onto a single chip, then aligning the active layer of the light source to the active layer of the PV device can yield an efficient OPT system.

Figure 3:
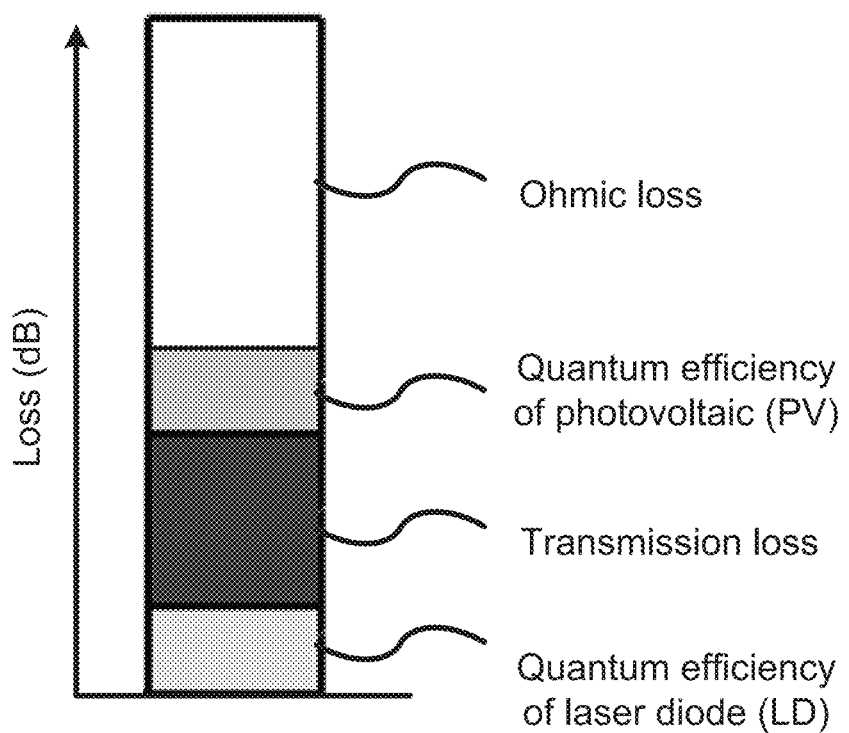
FIG. 3 shows a bar chart of an example of loss mechanisms in an OPT system.

In addition to decreasing absorption losses, bringing the light source 110 and PV device 120 into closer proximity (e.g., by integrating them on a single chip) can reduce scattering losses, thus further improving the efficiency of the OPT system. As shown in FIG. 3, conventional OPT system have multiple sources of loss. The sources of power loss include: (i) the quantum efficiency of the electrical-to-optical conversion process in the light source, (ii) the loss of photons along the transmission path from the light source to the PV devices due to absorption and scatter, (iii) the quantum efficiency of the optical-to-electrical conversion process in the PV cells, and (iv) ohmic losses in the semiconductor material, metallization layers, wire bonds, etc. Bringing the light source 110 and the PV device 120 into closer proximity can decrease the scattering losses. As discussed above, bringing the light source 110 and the PV device 120 also has the added advantage of decreasing the size of the OPT system and reducing costs. Further, using a side-incidence arrangement reduces absorption loses that are incurred in conventional PV devices, in which the light first propagates through a conduction before reaching the depletion region of the PN-junction.\

Figure 4A:
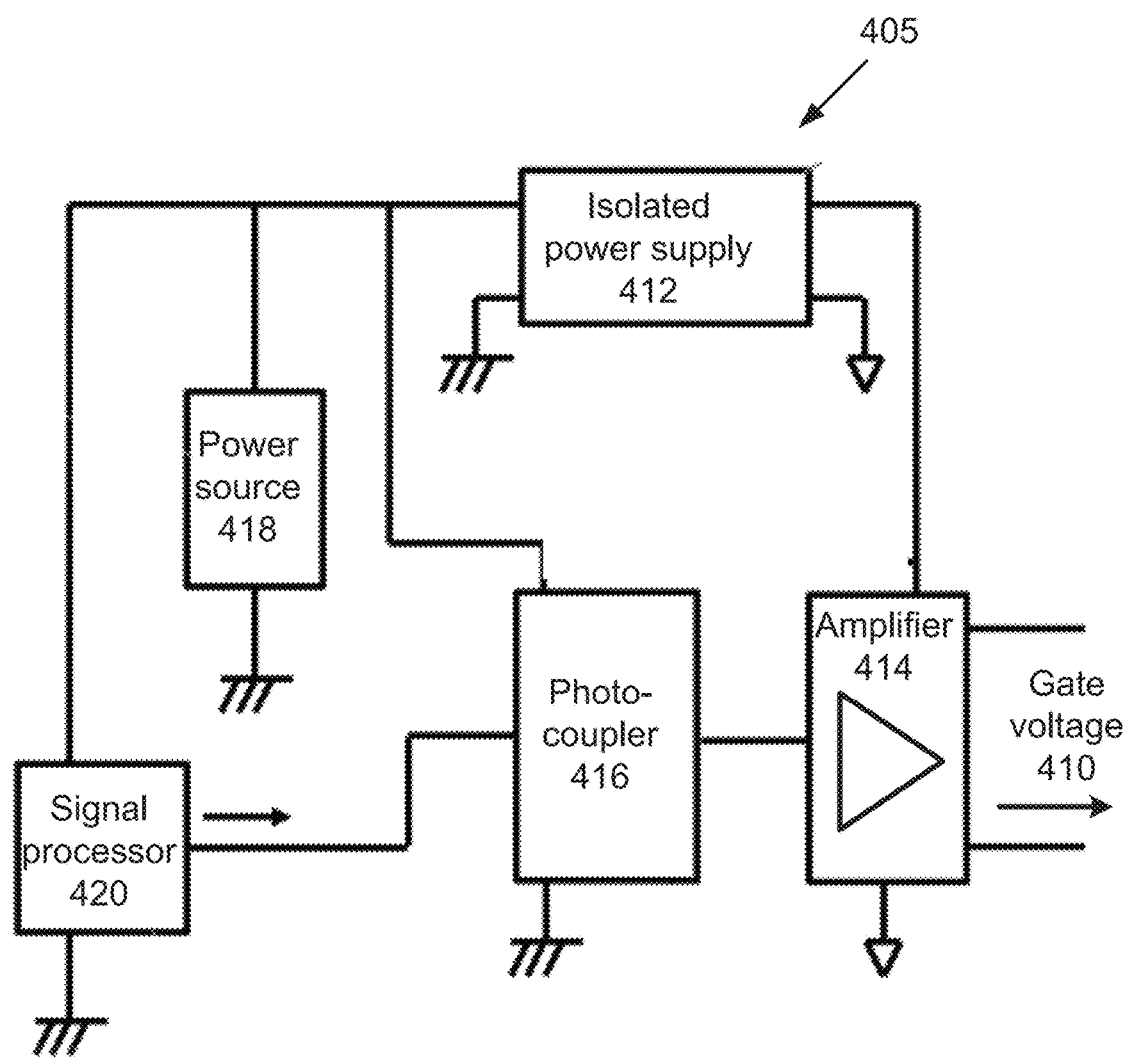
FIG. 4A shows a circuit diagram of one implementation of a gate voltage circuit and a signal processor circuit that are mutually isolated by using, among other things, an isolated power supply.
Figure 4B:
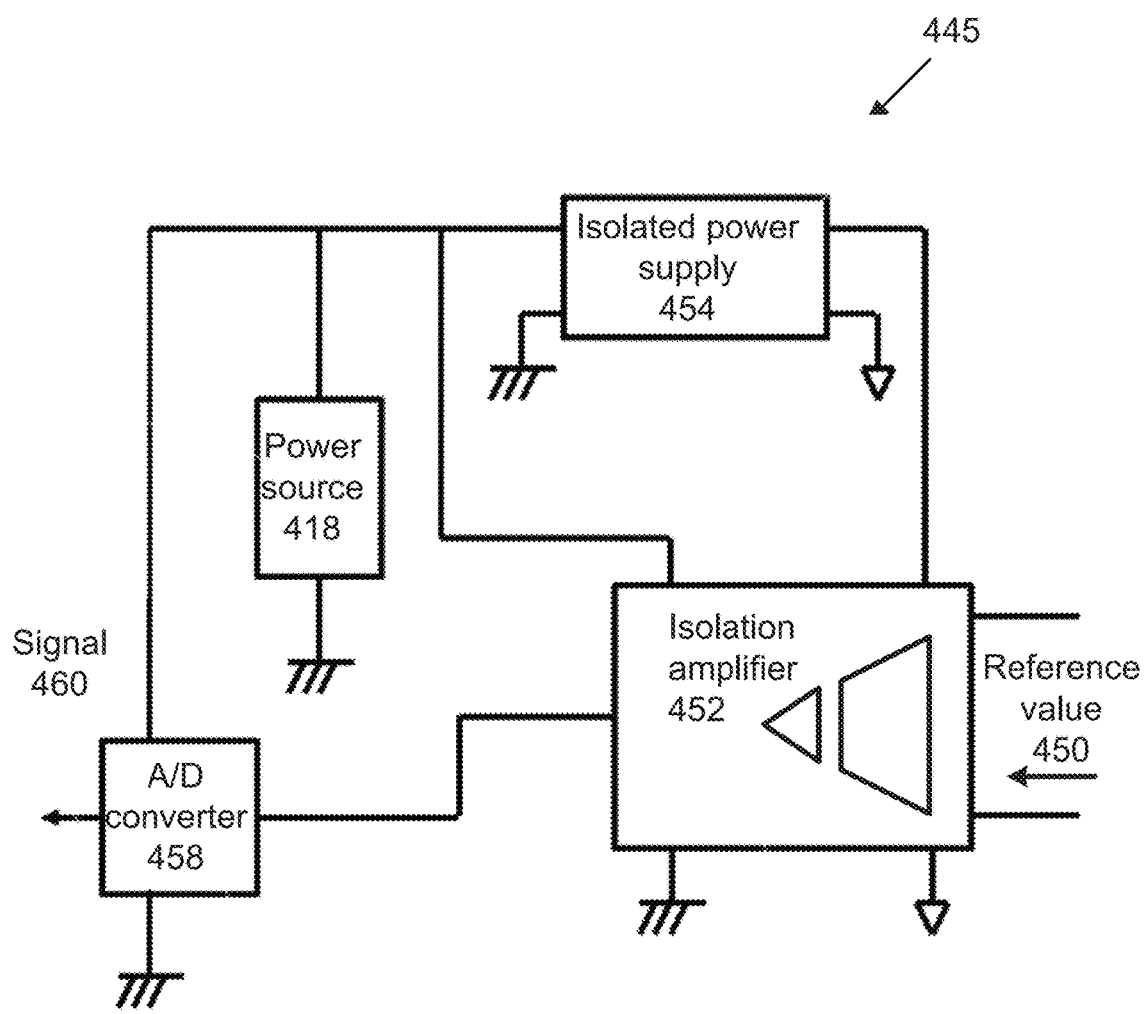
FIG. 4B shows a circuit diagram of one implementation of a current sensing circuit and an analog-to digital (A/D) circuit that are mutually isolated by using, among other things, an isolated power supply.

FIGS. 4A and 4B show examples of applications in which an OPT system is desired to provide electrical isolation between a powering circuit and a powered circuit. In an electrically-powered motor vehicle, for example, the high voltages and currents used to drive the electric motor can result in a high EMI environment. An electrically-powered motor vehicle can rely on measurement and control circuitry that would be adversely affected if EMI were transferred from the motor circuits to the control and measurement circuitry. Effective electrical isolation can be crucial in maintaining a high level of performance in these noise sensitive circuits.

FIG. 4A shows an example of a gate-voltage circuit 405 that supplies a gate voltage 410 to the gate of an insulated-gate bipolar transistor (IGBT). For example, the gate voltage can control a current to the electric motor. In one implementation, the signal processor 420 performs digital signal processing on received signals, produces a digital output based on the signal processing, and converts the digital signal to an analog signal using a digital-to-analog converter that is included in the signal processor 420. To mitigate the effects of noise and EMI to the signal processor 420, a low noise power source 418 (e.g., a battery) is used, and the signal processor 420 and the power source 418 are electrically isolated from the noise on the gate-voltage circuit connecting to the IGBT. The signal processor 420 can be operated at a relatively low voltage (e.g., the voltage supplied by the power supply 418 can be 5 volts), compared to the higher voltage of the amplifier 414 (e.g., the voltage supplied to amplifier 414 can be 15 volts). Also, the ground connection of the signal processor 420, the power supply 418, and the photo-coupler 416 can be a body-ground connection.

To prevent EMI from coupling into the signal processor 420, the signal processor 420 is isolated from the circuit of the amplifier 414 by using a photo-coupler 416 to optically transmit the analog output from the signal processor 420 to the amplifier 414. The amplifier 414 then amplifies and transmits the received signal to the IGBT as the gate voltage 410. The ground of the amplifier 414 is floated, and the voltage supplied to the amplifier 414 can be greater than the voltage supplied to the signal processor 420 (e.g., the voltage to amplifier 414 can be 15 volts).

The power to the amplifier 414 is supplied using an isolated power supply 412 that transmits power from the power supply 418 to the amplifier 414 while maintaining electrical isolation between the two circuits. The isolated power supply 412 also steps-up the voltage from the 5 volts of the power supply 418 to the 15 volts used by the amplifier 414 These functions of the isolated power supply 412 (i.e., supplying power while providing electrical isolation) can be performed by several different devices. For example, an isolation transformer could be used as the isolated power supply 412 to provide isolation between the signal processor 420 and the amplifier 414. However, an isolation transformer might not sufficiently suppress noise that is coupled from the amplifier side of the transformer to the signal processor side of the transformer. Especially at high frequencies, there is significant coupling of noise between the two circuits due to the stray capacitance in the isolation transformer that results in significant capacitive coupling between the two sides of the transformer. Thus, for the isolated power supply 412, an OPT system is preferable to an isolation transformer because the OPT system can provide better electrical isolation especially at high frequencies. Further, the OPT systems have the additional advantage that they can be smaller than isolation transformers.

FIG. 4B shows a motor current sensing circuit 445, as a second example of using an isolated power supply. In FIG. 4B, a reference value 450 is transmitted to an analog-to-digital (A/D) converter 458 using an isolation amplifier 452. The signal 460 from the A/D converter 458 can then be used by a signal processor (e.g., the signal processor 420) for various decisional and control functions. Accurate conversion of the reference value 450 to a digital signal 460 is important to ensure that errors do not propagate and become compounded in these various decisional and control functions.

As shown in FIG. 4B, the reference value 450 is received as an input to an isolation amplifier 452. The isolation amplifier 452 has two sides that are electrical isolated in order to prevent noise on the current sensing side of the circuit from propagating to the A/D convert side of the circuit and adversely affecting the signal 460. Similarly, the isolated power supply 454 also has two sides corresponding to the two circuits of the isolation amplifier 452. These two sides of the isolation amplifier 452 prevent the alternative path of noise being transmitted through the voltage supply lines to the A/D converter 458. Thus, there are two layers of electrical isolation: (i) the signal transmitted through the isolation amplifier 452 corresponding to the reference value 450 and (ii) the voltage supply rail that is isolated using the isolated power supply 454.

For both the isolation amplifier 452 and the isolated power supply 454, the circuitry on the right-hand side corresponds to the high-voltage motor drive with a floated ground, and the circuitry on the left-hand side corresponds to the low-voltage A/D converter 458. The right-hand side circuitry corresponding to the motor drive samples the high voltage motor current, and uses a floated ground line. The left-hand side circuitry corresponding to the A/D converter 458 uses a low voltage and a body-connection ground. This left-hand side circuitry is shielded from the EMI of the motor-drive side using both the isolation amplifier 452 and the isolated power supply 454. The isolation amplifier 452 provides electrical isolation between the low voltage and low noise circuit and the high voltage motor drive circuit. Power to the low-voltage side of the isolation amplifier 452 is supplied directly by the power source 418, whereas power to the high-voltage side of the isolation amplifier 452 is supplied indirectly from the power source 418 through the isolated power supply 454. An OPT system is desirable as the isolated power supply 454 for the same reasons identified above for the isolated power supply 412 used in circuit 405. For example, the OPT system can provide better isolation at high frequencies than an isolation transformer.

Figure 5:
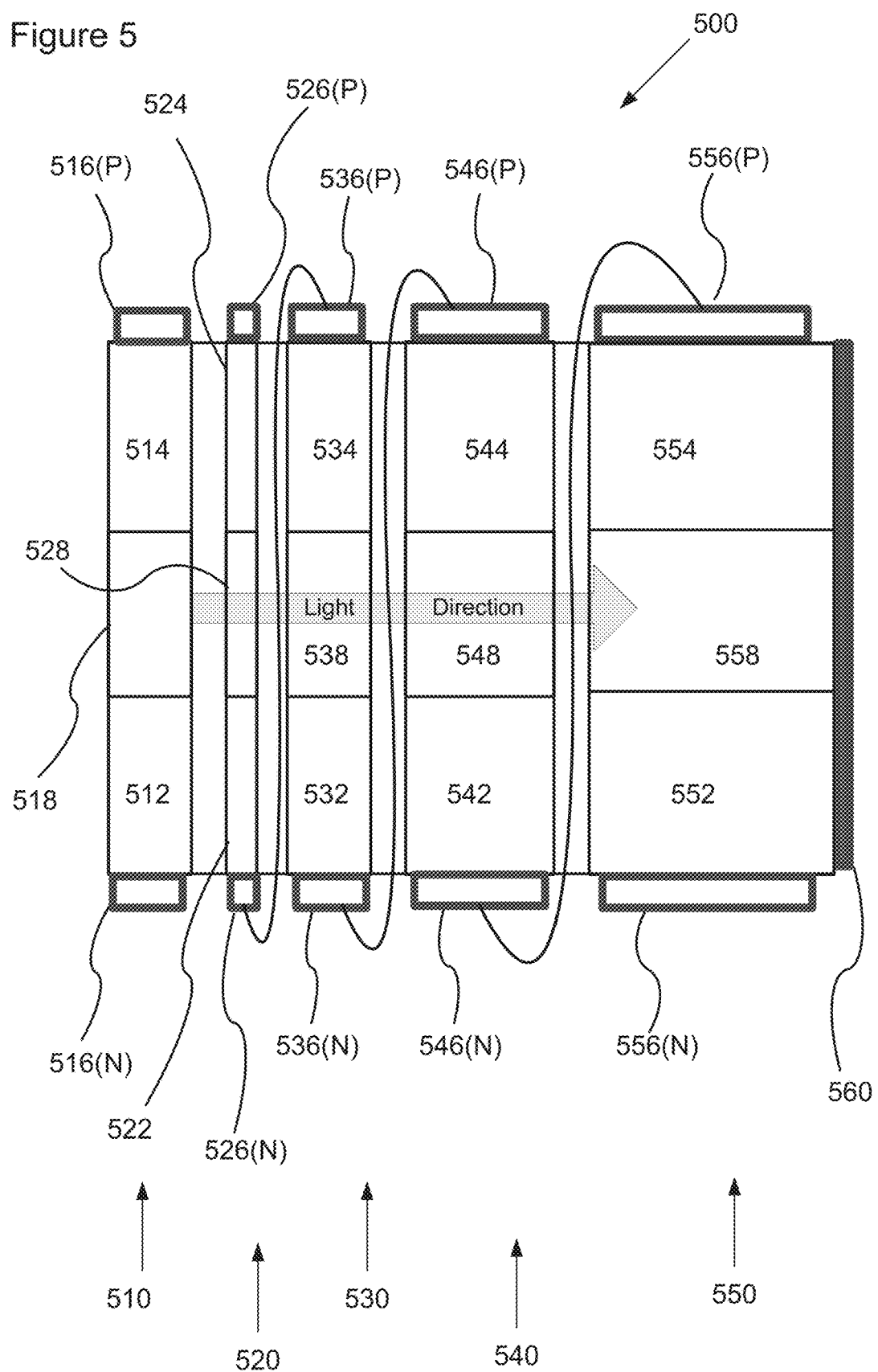
FIG. 5 shows a side sectional view of one implementation of a disk-shaped OPT system.
Figure 6:
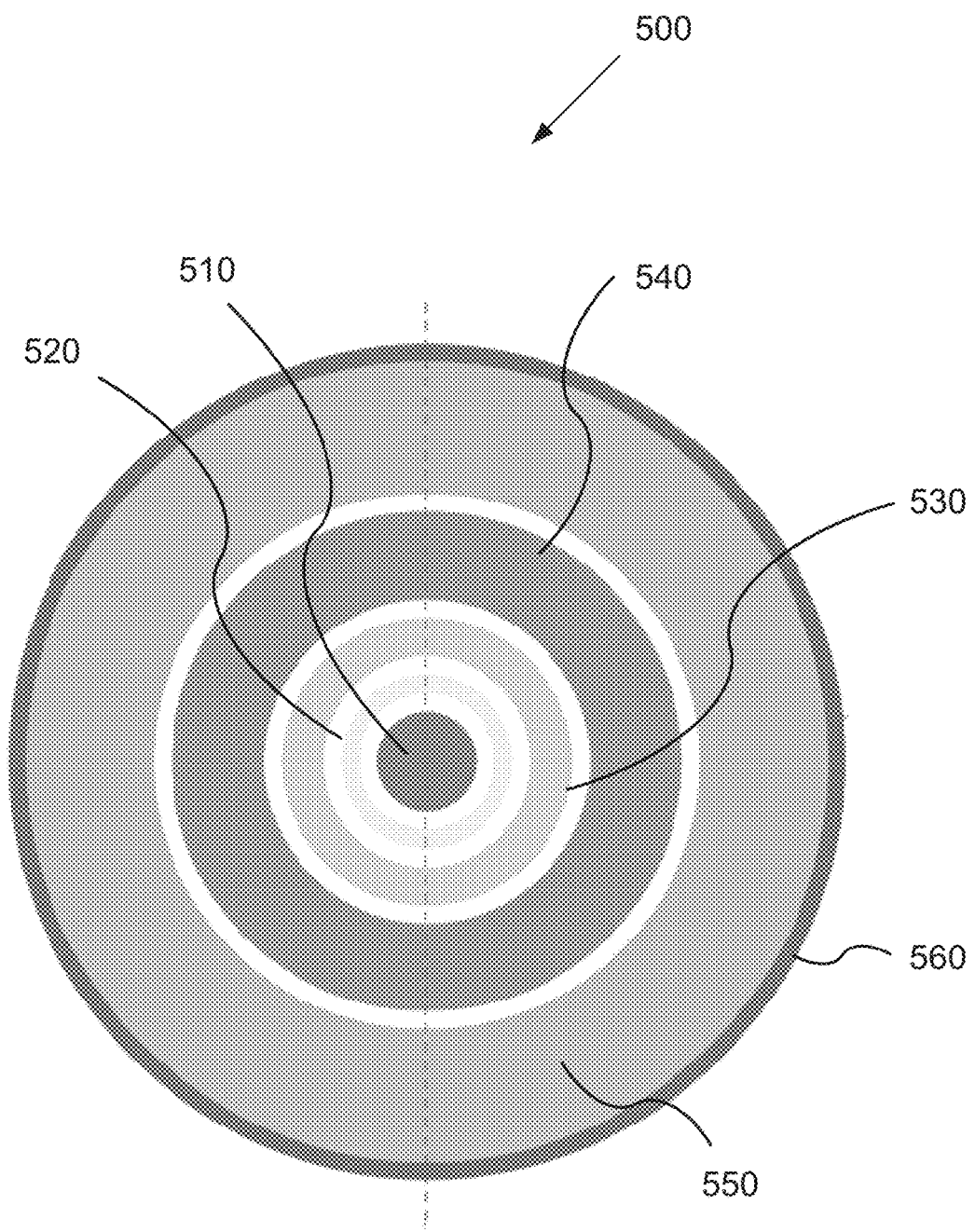
FIG. 6 shows a top view of one implementation of a disk-shaped OPT system.

FIGS. 5 and 6 show an implementation of a disk-shaped OPT device 500 having a central light source 510 surrounded by concentric rings of PV devices 520, 530, 540, and 550. FIG. 5 shows a sectional view of the right-hand side of the OPT system 500, and FIG. 6 shows a top view of the OPT system 500. FIGS. 5 and 6 are not drawn to scale. Around the outermost edge of the devices is a mirror 560 to reflect light reaching the mirror back through the PV devices 520, 530, 540, and 550, where the light can be absorbed and converted into electrical energy. The mirror 560 is optional. Each of the central light source 510 and the concentric ring PV devices 520, 530, 540, and 550 has an active layer sandwiched between two conduction layers. For example, the upper conduction layer/region can be n-doped, and the lower layer/region can be p-doped. The active layer can be the depletion region at the junction between the n-doped and p-doped regions. Alternatively, as shown in FIG. 5, the upper conduction region can be p-doped, and the lower region can be n-doped.

In one implementation, the light source 510 includes an electrode 516(P) that is electrically connected to an upper conduction region 514 that is a p-doped semiconductor. The electrode 516(N) is electrically connected to the lower conduction region 512 that is an n-doped semiconductor, and an active layer 518 is located at the junction between the p- and n-doped regions 514 and 512. As the PN junction is forward biased and current is injected into the PN junction, electrons from the n-doped region and holes from the p-doped region combine in the active region to generate light. The light source can be configured to preferentially radiate radial into the active regions of the PV devices 520, 530, 540, and 550, along the arrow labeled "light direction," as shown in FIG. 5.

In one implementation, the PV devices 520, 530, 540, and 550 each respectively includes a p-doped conduction region (e.g., 524, 534, 544, and 554) that is electrically connected to a metallization layer (e.g., 526(P), 536(P), 546(P), and 556(P)). Each of the PV devices 520, 530, 540, and 550 also include respective n-doped conduction regions (e.g., 522, 532, 542, and 552) that are electrically connected to respective metallization layer (e.g., 526(N), 536(N), 546(N), and 556(N)). In between the conducting layers of each PV device is an active region that corresponds to the depletion region of the PN junction. In certain implementations, the width of the depletion can be increased by using an intrinsically doped region at the PN junction to create a PIN photodiode. Herein, the phrase "PN junction" is defined broadly to include PN junction both with and without an intrinsic layer increasing the width of the depletion region. In FIG. 5, the active region of PV device 520 is the region 528. Similarly the active regions of PV devices 530, 540, and 550 are respectively regions 538, 548, and 558.

The mirror 560 is arranged around the outer edge of the disk OPT system 500 to reflect light that has traversed the PV devices and reached the outer boundary back through the PV devices a second time in order that the residual light can be absorbed during this second pass and converted into electrical energy. Thus, the optional mirror 560 improves the efficiency by increasing the light absorbed in the PV devices. Rather than the transmitted light escaping out of the disk OPT system 500 once the light reaches the outer boundary of PV device 550, the light is reflected back through PV device 550 towards the light source where the residual light is absorbed and converted into current as it passes through each of the PV devices a second time. Because, unlike conventional solar PV device, the light does not pass through a conduction regions in order to reach the active regions, the OPT system arrangement shown in FIG. 5 can be more efficient than previous OPT systems.

Further, unlike conventionally stacked PV devices, in which adjacent PV devices are separated using a PN tunnel junction with an associated negative voltage that decreases the aggregate series voltage of conventional PV stacks, each PV device in FIG. 5 is electrically connected in series to the other PV devices using a conductor not a tunnel junction. The aggregate series voltage of the PV devices in FIGS. 5 and 6 is the sum of each voltage for all of the PN junctions. For example, each of the PV device 530, 540, and 550 have a wired connection from the respective metallization layers 536(P), 546(P), and 556(P) to the respective metallization layers 526(N), 536(N), and 546(N) of PV devices 520, 530, and 540, as shown in FIG. 5. Thus, the aggregated voltage of the PV devices is four time the voltage of each PV device individually.

The PV devices 520, 530, 540, and 550 could be electrically connected in parallel rather than be wired in series, according to an alternative implementation. However, there are several reasons why wiring the PV devices in series to obtain a higher voltage is desirable. First, many applications use higher voltages, and it is more efficient to achieve a higher voltage directly rather than by using a DC-to-DC boost converter to step up the voltage of low voltage high current source. For example, in both applications shown in FIGS. 4A and 4B the isolated power supply is used to step up the voltage from approximately 5 volts to approximately 15 volts and 10 volts respectively. The voltage of each PV device is determined by the bandgap of the semiconductor, which is approximately 1 eV for most semiconductors corresponding to a voltage of 1 volt per PV device. While DC-to-DC step-up/boost converters can be used to convert a high-current and low-voltage PV power source to a higher-voltage, these converters can be inefficient. Moreover, the power consumed at the PV device is given by $$P=I^2R,$$

wherein P is the power consumed, I is the current, and R is the resistance. Thus, the power dissipated in the PV devices is proportional to the square of the current, making a lower-current higher-voltage device is more efficient. In contrast to the quadratic power consumed when using a high current source, stringing the PV devices in series can result in a high-voltage low current source, in which the power dissipated in the PV devices is linearly proportional to the number of PV devices. Thus, connecting the PV devices in series can result a more efficient power source to obtain a 10 to 15 volt rail used by the amplifier 414 and the isolation amplifier 452 respectively.

FIG. 6 shows a top view of the light source 510 and PV devices 520, 530, 540, and 550. As the PV devices are arranged in concentric circles around the light source 510 at the center. For the PV devices farther from the center, the PV devices are not only become larger in circumference, but they also increase in the amount of material through with the light rays propagate (i.e., the propagation length of light in the PV device increases for PV devices farther from the light source 510). This widening of the PV devices farther from the light source 510 offsets the exponential absorption of light propagating through the active regions of the PV devices. Each PV device 520, 530, 540, and 550 is configured to generate the same current as every other of the PV devices. As the residual intensity of the light transmitted through previous PV devices dwindles, the outer PV devices have wider propagation lengths in order to absorb a higher percentage of the residual light. When the PV devices are connected in series, ensuring that each PV device produces the same current increases the efficiency of the OPT system. When all of the PV devices connected in series produces equal current, then the OPT system performs with optimal efficiency. By increasing the width of the PV devices farther-from-center PV devices the amount of light absorbed in these PV devices can be equal to the nearer-to-center PV devices even though the light incident on these father-from-center PV devices has been attenuated due to absorption in the nearer-from-center PV devices. Generally, the light absorption will be governed by Beer's law (i.e., exponential absorption as a function of position), but at higher light intensities saturation and other nonlinear effects can cause the absorption to deviate from the Beer's law. Moreover, the reflection of light by mirror 560 will also effect on the optimal thickness of the respective PV device. All of these influences are accounted for in determining the optimal thickness of the PV devices 520, 530, 540, and 550 in order to ensure that each PV device produces an equal current in the desired operation range.

In FIGS. 5 and 6, the number of PV devices connected in series is four. In alternative implementations, the number of PV devices can be larger or smaller than four. Also, the mirror 560 can optionally be omitted.

Figure 7A:
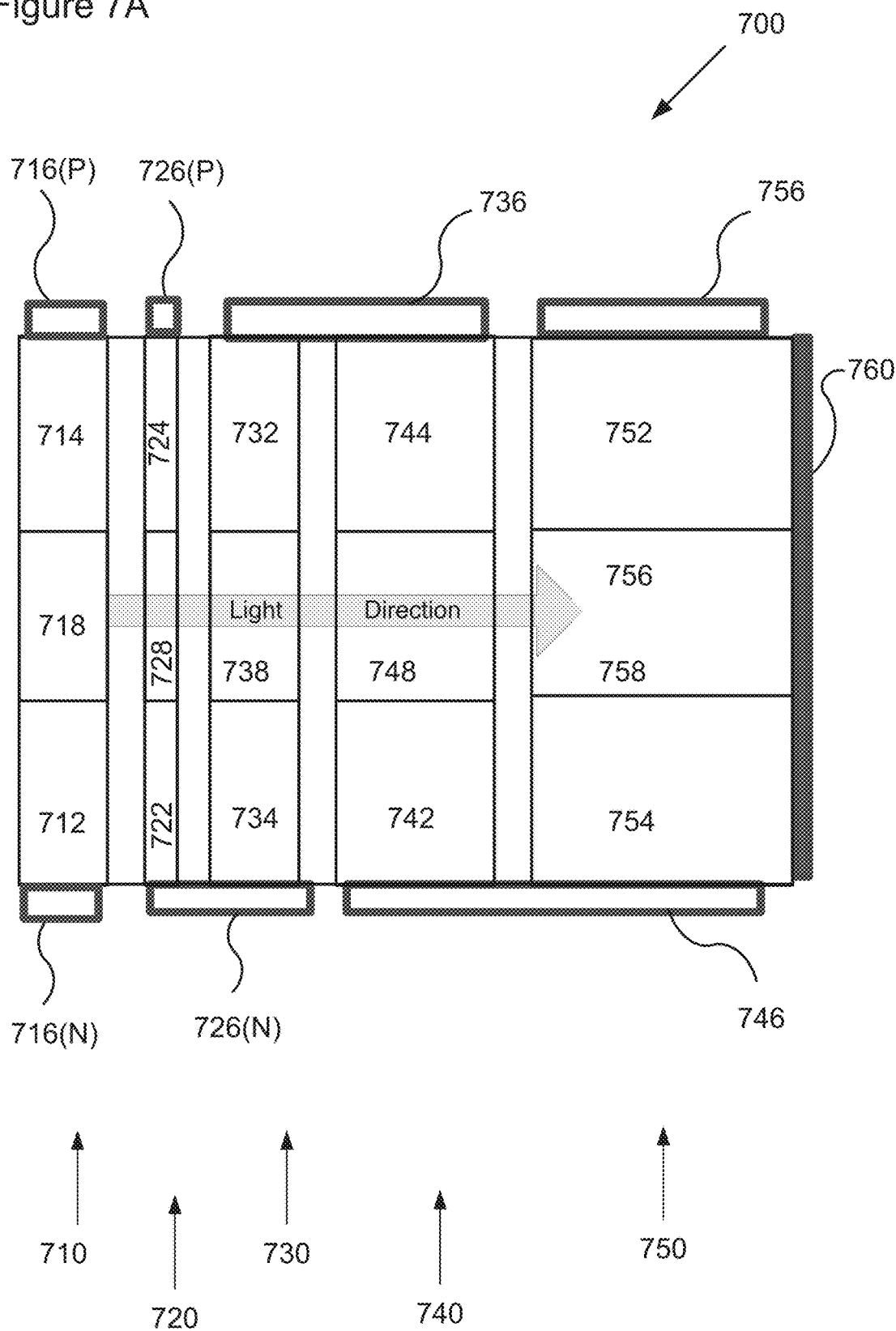
FIG. 7A shows a side sectional view of one implementation of a disk-shaped OPT system having alternating n-doped and p-doped upper conduction regions.
Figure 7B:
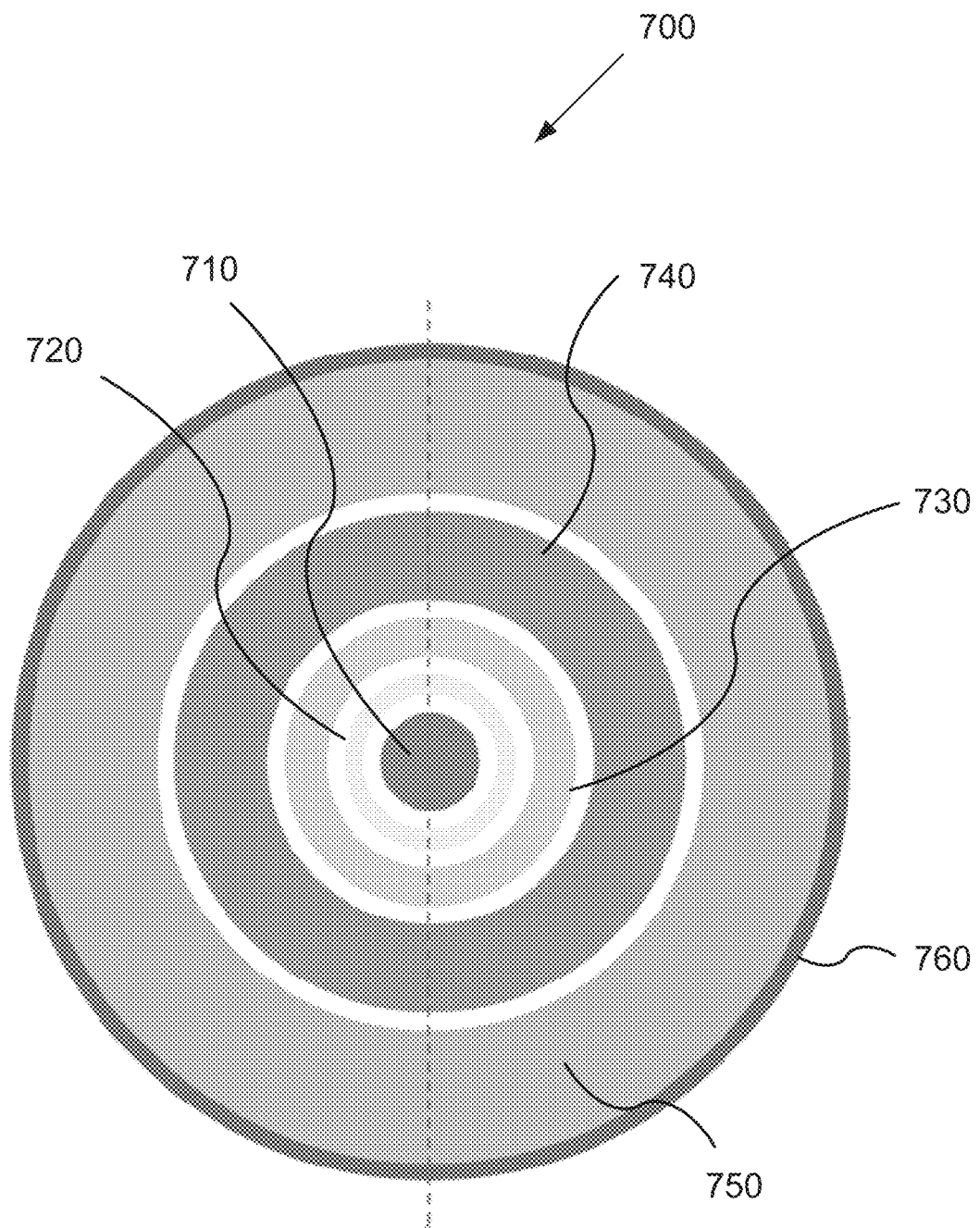
FIG. 7B shows a top view of one implementation of a disk-shaped OPT system having alternating n-doped and p-doped upper conduction regions.

FIGS. 7A and 7B shows another implementation, in which the p-doped conduction layer is on top for the odd PV devices 720 and 740 (i.e., for the first and third PV devices) and n-doped conduction layer is on top for the even PV devices 730 and 750 (i.e., for the second and fourth PV devices). In this case odd and even refer to the order of proximity of the PV devices to the central light source 710. As in the OPT system 500, light propagates radial outward from the active region 718 of the light source 710 and propagates through the active regions 728, 738, 748, and 758 of the PV devices 720, 730, 740, and 750 respectively. The light source 710 can be, for example, an LED or an LD that generates light when current is injected into the active regions from the electrode 716(P) connected to the p-doped conduction layer 714 and the electrode 716(N) connected to the n-doped conduction layer 712.

In one implementation, the first PV device 720 includes an electrode 726(P) electrically connected to the p-doped semiconductor 724 and an electrode 726(N) electrically connected to the n-doped semiconductor 722. The electrode 726(N) is also electrically connected to the p-doped semiconductor 734 of the PV device 730. The PV device 730 also includes an n-doped semiconductor 732 that is electrically connected to an electrode 736, which is also connected to the p-doped semiconductor 744 of PV device 740. The PV device 740 also includes an n-doped semiconductor 742 that is electrically connected to an electrode 746, which is also connected to the p-doped semiconductor 754 of PV device 750. Finally, the PV device 750 includes an n-doped semiconductor 752 that is electrically connected to an electrode 756. Thus, the PV devices can be connected in series without requiting electrical connections extending from the top of one PV device to the bottom of the neighboring PV device. The mirror 760 reflects light exiting the last PV device 750 back towards the light source 710, so that the light can be absorbed and converted into current during the second pass through the PV devices 720, 730, 740, and 750.

Figure 8:
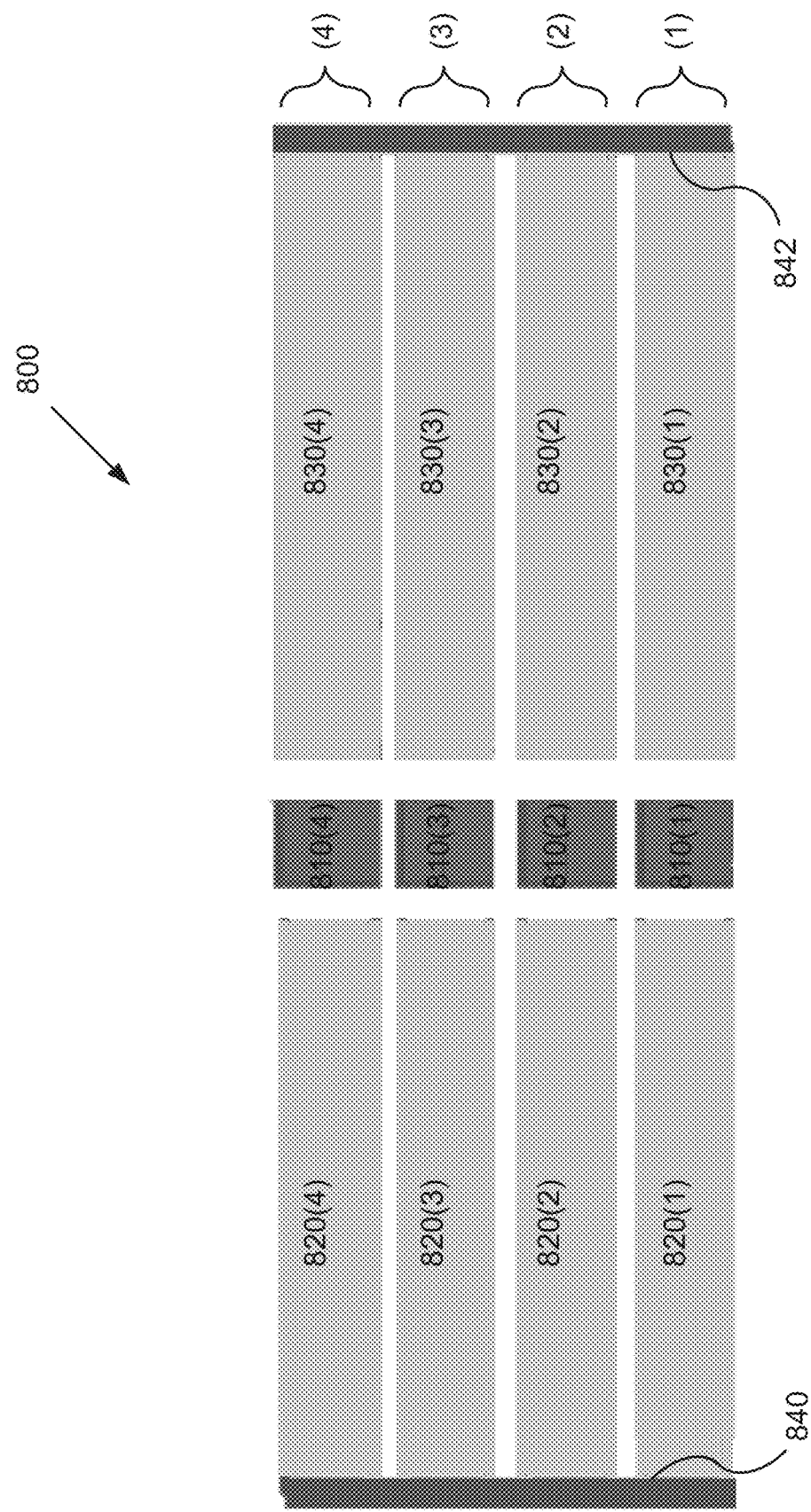
FIG. 8 shows a top view of one implementation of a laser-cavity OPT system.
Figure 9:
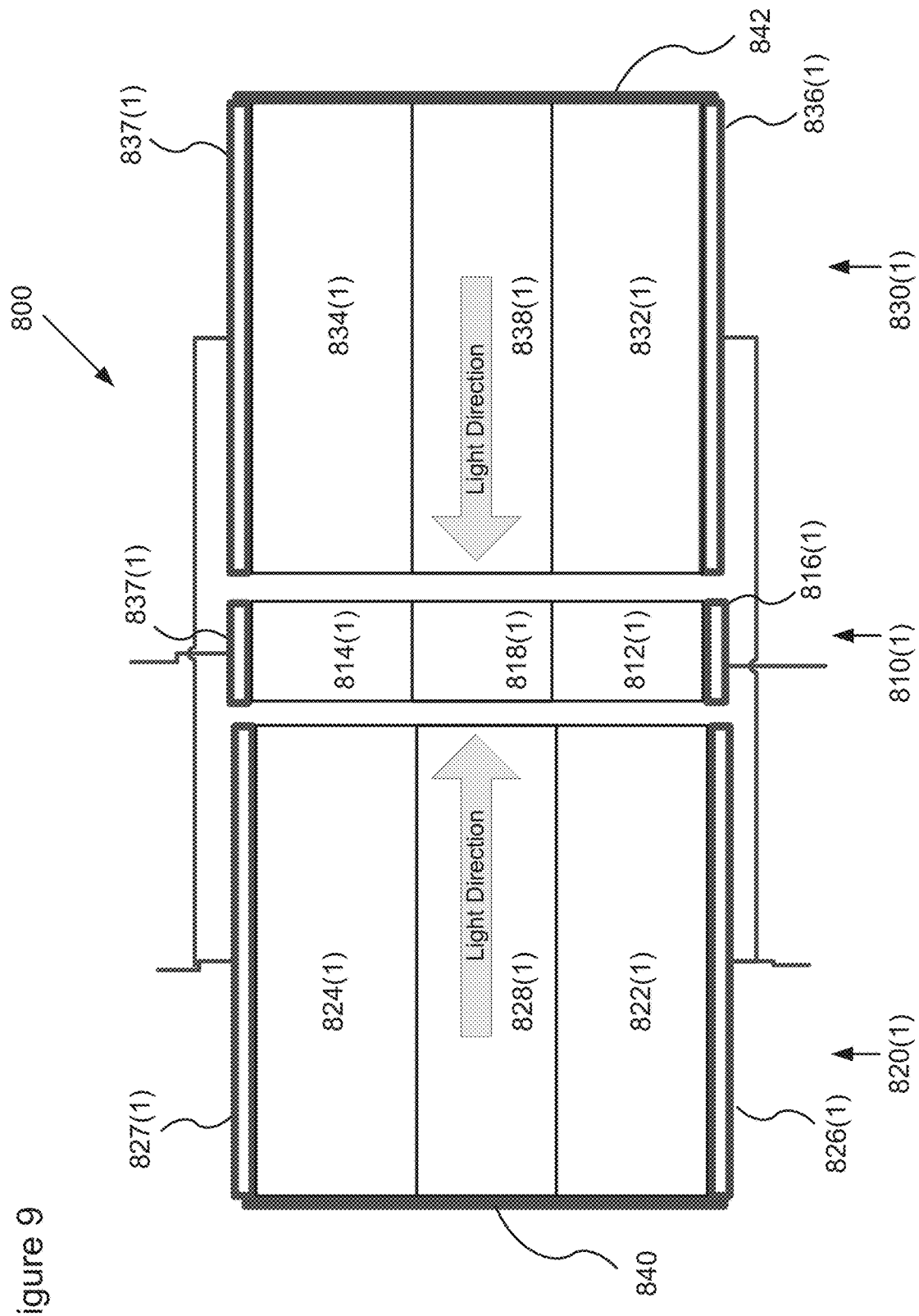
FIG. 9 shows a side view of one implementation of a laser-cavity OPT system.

FIGS. 8 and 9 show implementation of another OPT system 800. FIG. 8 shows a top view of the OPT system 800, and FIG. 9 shows a side view of the OPT system 800. The OPT system 800 includes PV devices that are integrated in the cavity of a laser oscillator. For example, the PV devices can each be in an LD laser oscillator cavity.

The OPT system 800 includes four subsystems (1), (2), (3), and (4). Each subsystem has two gain sections (e.g., 820(1) and 830(1)) and a single absorption region (e.g., 810(1)). The first subsystem (1) includes two gain sections 820(1) and 830(1) and includes the absorption region 810(1). The second subsystem (2) includes two gain sections 820(2) and 830(2) and includes the absorption region 810(2). The third subsystem (3) includes two gain sections 820(3) and 830(3) and includes the absorption region 810(3). The fourth subsystem (4) includes two gain sections 820(4) and 830(4) and includes the absorption region 810(4).

The gain regions and absorption regions are positioned between two mirrors 840 and 842 to create optical resonator cavity (also referred to as an oscillator cavity or simply as oscillator). For example, the optical resonator cavity can be a flat-flat resonator cavity. When the small-signal gain from the gain regions is sufficiently large that the round trip gain of the resonator cavity exceeds the round trip loss (e.g., due to absorption in the absorption section loss at the mirror, and miscellaneous loss sources), then the respective subsystem will begin to lase at a resonance frequencies of the optical cavity. Even when the subsystems (1), (2), (3), and (4) are below the gain threshold for lasing, the light propagating along the cavity modes of the optical resonator will be absorbed by the active layer of the PV device in the absorption sections 810(1), 810(2), 810(3), and 810(4). However, if the cavities lase, then the stimulated emission results in the gain sections 820(1), 820(2), 820(3), 820(4), 830(1), 830(2), 830(3), and 830(4) preferential emit into the cavity modes that are arranged to pass through the respective PV absorption sections 810(1), 810(2), 810(3), and 810(4). Thus, when the cavities lase, the efficiency of the energy transfer from the gain media (i.e., the light sources) to the PV devices increases. Therefore, when lasing occurs, the efficiency of the OPT system is enhanced.

In one implementation, a single mirror 840 is arranged on the left-hand side of the optical cavities, and a single mirror 842 is arranged on the right-hand side of the OPT system 800, as shown in FIG. 8. In another implementation, each subsystem (1), (2), (3), and (4) has its own mirrors, and each subsystem (1), (2), (3), and (4) can have an optical resonator arranged separately from the other subsystems.

FIG. 9 shows a side view of the OPT system 800, showing the subsystem (1). The gain sections 820(1) and 830(1) respectively include a p-doped conduction region 824(1) and 834(1) and an n-doped conduction region 822(1) and 832(1). Between the p-doped and n-doped conduction regions are the active regions 828(1) and 838(1), in which the recombination of electrons and holes produces photons and gain when the current is high enough to overcome the intrinsic loss of the semiconductor. The arrows in the active region show the direction of the light in the cavity modes of the optical resonator as defined by the mirrors 840 and 842. The current driving the gain regions flows through the electrodes 826(1), 827(1), 836(1), and 837(1). In one implementation, electrode 826(1) is electrical connected to electrode 836(1), and electrode 827(1) is electrical connected to electrode 837(1). As the active layer 818(1) of the PV device 810(1) absorbs the photons emitted by the two gain regions, the light is converted to a current which is then conducted through the n-doped region 812(1) and the p-doped region 814(1) through the respective electrodes 816(1) and 817(1) to the powered device (e.g., an isolation amplifier 452 of amplifier 414 in FIGS. 4B and 4A respectively). The PV devices 810(1), 810(2), 810(3), and 810(4) can be connected in series to provide a voltage that is four times greater than the current of each individual PV device. The OPT system 800 can be configured such that an equal current provided by each of the PV devices 810(1), 810(2), 810(3), and 810(4).

In one implementation, multiple PV devices are arranged within a single optical resonator. Thus, if the light intensity increases or decreases within the optical resonator, the current produced by all of the PV devices within the optical resonator will change together proportionally together. Thus, the current of the PV devices will be matched, regardless of changes affecting light output into the optical resonator cavity. In one implementation, the optical resonators are configured to provide feedback that enables each of the PV devices to generate an equal current.

Figure 10:
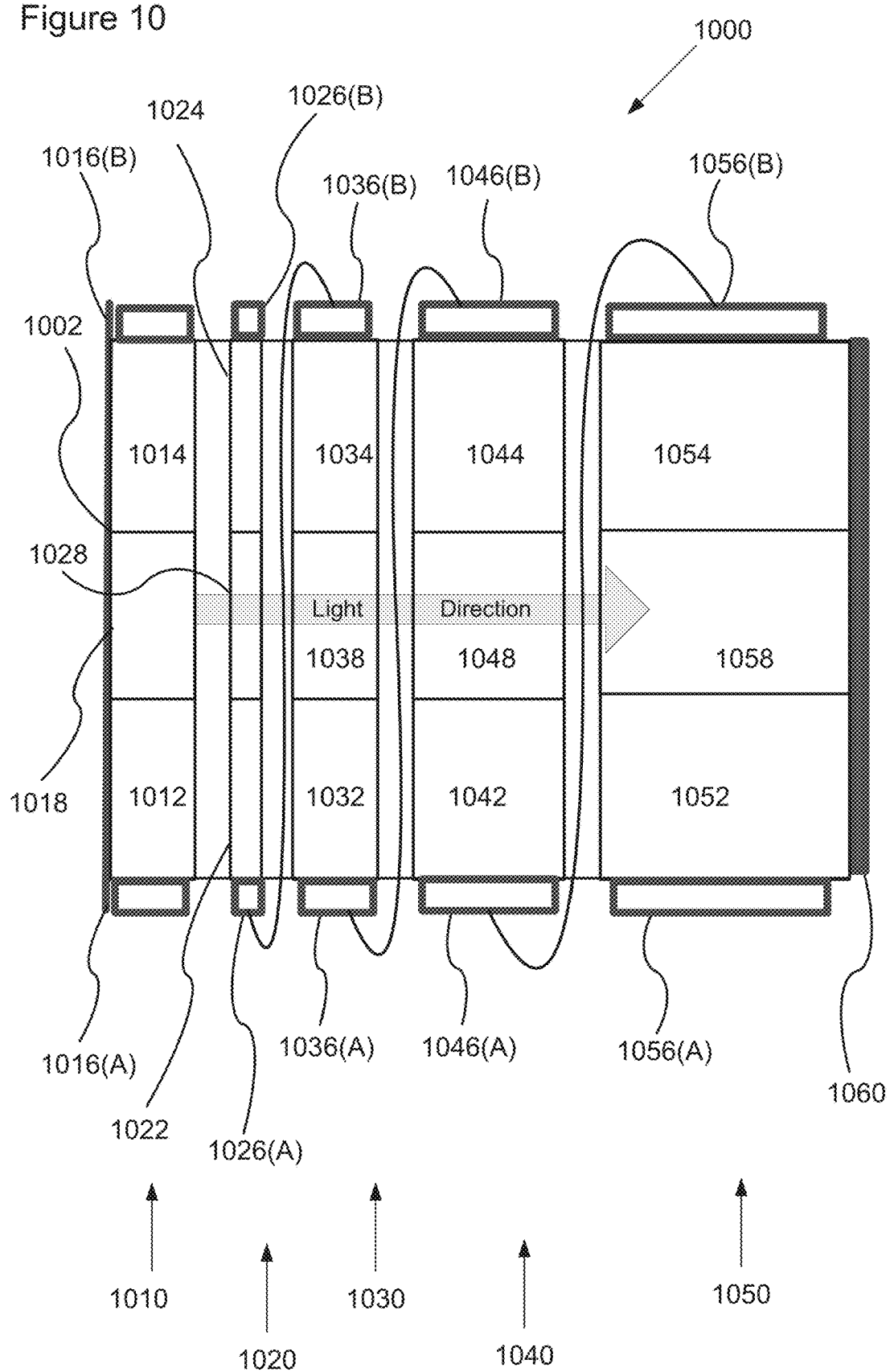
FIG. 10 shows a side view of one implementation of a linear propagation OPT system.
Figure 11:
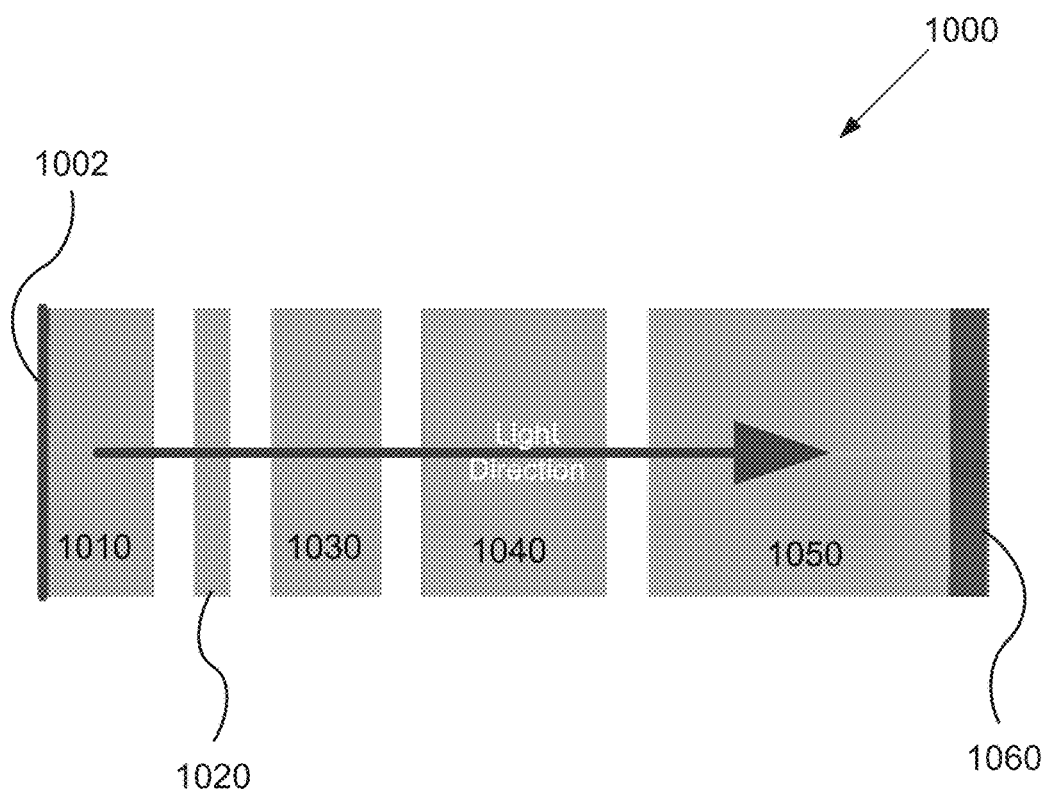
FIG. 11 shows a top view of one implementation of a linear propagation OPT system.

FIGS. 10 and 11 shows an implementation of an OPT system 1000. FIG. 10 shows a side view of the OPT system 1000, and FIG. 11 shows a top view of the OPT system 1000. Each of the light source 1010 and the PV devices 1020, 1030, 1040, and 1050 includes respective n-doped and p-doped regions with an active layers 1018, 1028, 1038, 1048, and 1058 sandwiched between the respective conduction regions. In one implementation, the regions 1012, 1022, 134, 1042, and 1054 are the n-doped regions, and the regions 1014, 1024, 132, 1044, and 1052 are the p-doped regions. In another implementation, the regions 1012, 1022, 132, 1042, and 1052 are the n-doped regions, and the regions 1014, 1024, 134, 1044, and 1054 are the p-doped regions. The PV devices are connected in series with the electrode of the n-doped region of each PV device electrically connected to the electrode of the p-doped region of the next farthest PV device from the light source 1010. In one implementation a mirror 1060 is included at the outside edge of the last PV device 1050. Also, a mirror 1002 can be included on the outside edge of the light source 1010 to redirect light exiting the back face of the light source 1010 back towards the PV devices. In one implementation, the mirror 1002 is a dielectric stack. In one implementation, the mirror 1002 is a distributed Bragg reflector. In one implementation, the mirror 1002 is a metallic mirror. In one implementation, the light source 1010 can be a VCSEL or an LD that preferential emits light in a narrow beam.

Figure 12A:
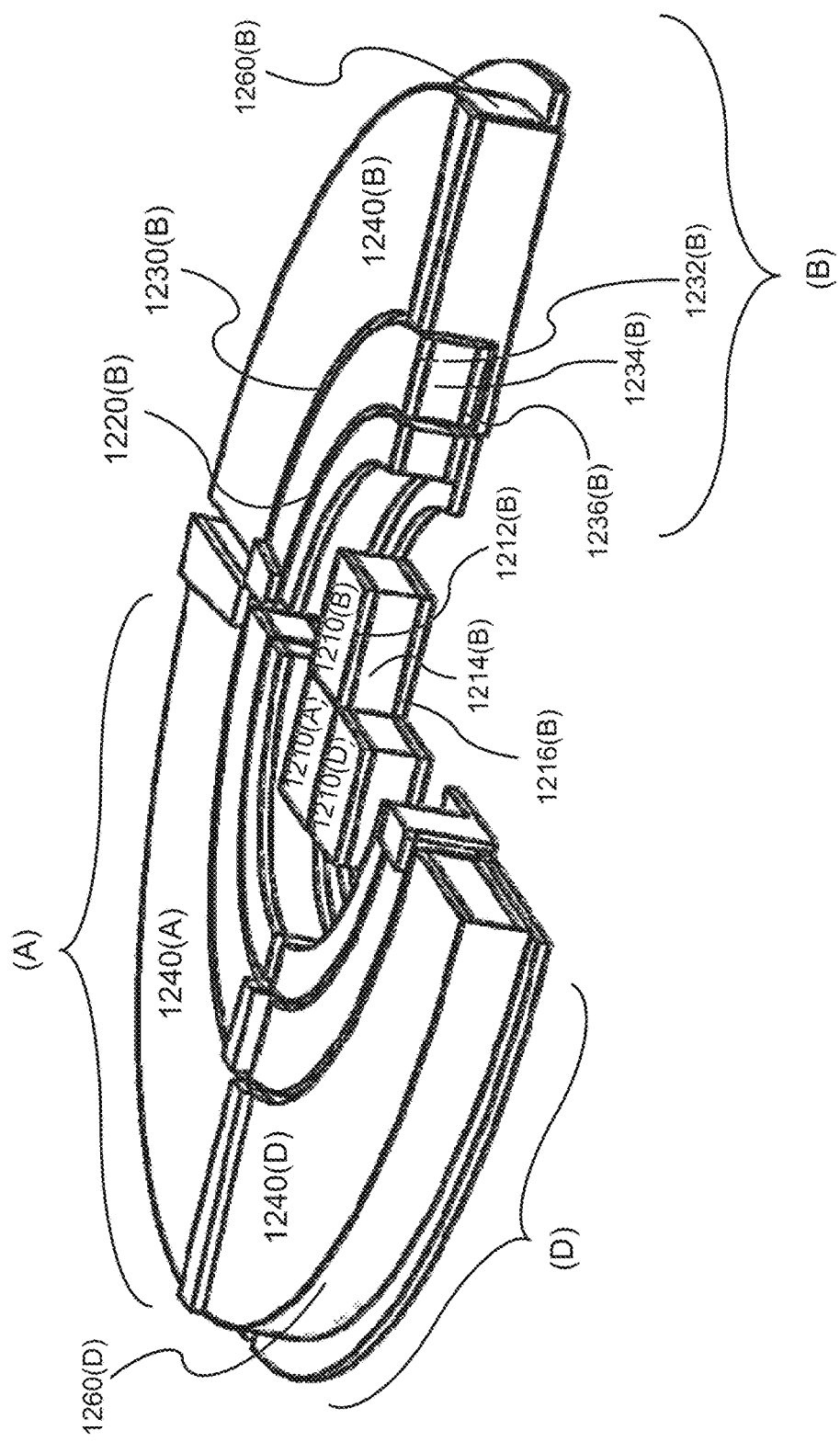
FIG. 12A shows a prospective view of one implementation of a disk-shaped OPT system sectioned into fourths.
Figure 12B:
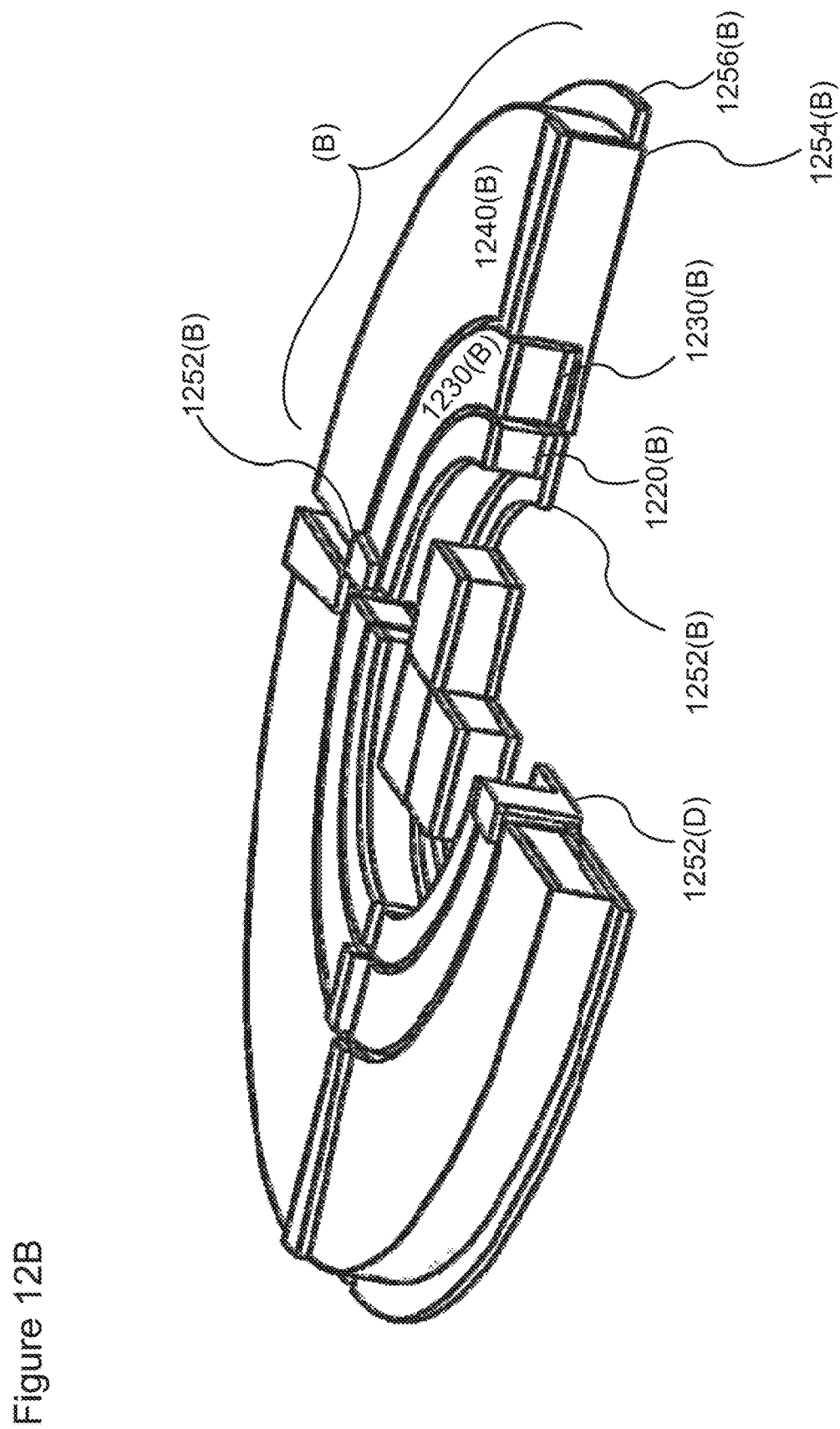
FIG. 12B shows a prospective view of one implementation of a disk-shaped OPT system where the electrodes connect the PV devices in series.

FIGS. 12A and 12B show an implementation of a OPT system using PV devices configured in concentric rings around a light source. FIGS. 12A and 12B both show an oblique view of the OPT system 1200. The OPT system 1200 has four section (A), (B), (C), and (D). In FIGS. 12A and 12B the section (C) is sectioned away to expose the internal structure of the OPT system 1200. Each section includes a light source 1210(A), 1210(B), 1210(C), and 1210(D), and each light source includes n-doped and p-doped regions (e.g., 1216(B) and 1212(B)) with an active region interposed between the n-doped and p-doped regions (e.g., 1214(B)). Each section includes three PV devices. The PV devices 1240(A), 1240(B), 1240(C), and 1240(D) are the outermost PV devices of their respective sections. Each PV device includes a respective n-doped region and p-doped region (e.g., 1236(B) and 1232(B) are the p- and n-doped regions of PV device 1230(B)) with an active region interposed between the n-doped and p-doped regions (e.g., 1214(B) is the active layer of PV device 1230(B)). Surrounding the disk-like OPT system are mirrors 1260(A), 1260(B), 1260(C), and 1260(D) to reflect light back towards the light sources in order to improve efficiency.

FIG. 12B shows the configuration of the electrodes in section (B) in order to connect the PV devices in series. In one implementation, all of the bottom conduction layers in the PV devices of FIGS. 12A and 12B have the same doping type (e.g., all the bottom conduction layers are n-doped). Similarly, all of the top conduction layers for the PV devices of FIGS. 12A and 12B have the same doping type (e.g., all the top conduction layers are p-doped). FIG. 12B shows that the electrode 1252(B) that is connected to the bottom conduction layer of PV device 1220(B) wraps around the end of PV device 1230(B) and onto the top conduction layer of PV device 1230(B). Electrode 1252(D), which is similar in shape and function to 1252(B), shows a view of how the electrodes connect from the bottom of one PV device to the top the next farther out PV device. Electrode 1254(B) connects to the bottom conduction layer of PV device 1230(B) and also connects to the top conduction layer of PV device 1240. Finally, electrode 1256(B) connects to the bottom conduction layer of PV device 1240(B). Thus, the PV devices are connected in series to provide a voltage that is the sum of all of the voltages of the PV device in a given section. The light propagation length in each PV device is configured to generate equal currents in each of the PV devices in each section.

In one implementation, each section is connected in series with the other sections, thus generating a voltage that is the sum of the voltages of all of the PV devices in all of the sections. For example in FIGS. 12A and 12B, there a e three PV devices in each section, and there are four sections for a total of twelve PV devices. Therefore, the resulting series voltage would be twelves times the voltage of an individual PV device. Further, the light sources are configured to provide equal light to all of the sections, such that each PV device generates an equal current.

In one implementation, the PV devices in each section are electrically connected in series, and the sections are electrically connected in parallel.

In one implementation, the PV devices in each section are electrically connected in parallel, and the sections are electrically connected in series.

In one implementation, the light sources 1210(A), 1210(B), 1210(C), and 1210(D) are a single light source radiating radially into the respective active regions of the PV devices.

In one implementation, the light sources 1210(A), 1210(B), 1210(C), and 1210(D) are each a separate light source.

When the PV devices are configured in concentric rings, as shown in FIG. 6 for example, or are configured in concentric arcs, and shown in FIG. 12A for example, having the respective light sources arranged at the center of the concentric rings or arcs is generally advantageous. However, the OPT system functions even when the respective light source is only substantially at the center of the concentric rings or arcs. For example, the OPT system functions when the respective light source of the OPT system is at any position within the ring defined by the inner-most PV device/devices. When the light source of the OPT system is within a inner circumference traced by the inner-most PV device/devices, then the light source is substantially at the center of the concentric rings or arcs of the PV devices.

In each of the OPT systems 500, 700, 1000, and 1200, optical power transfer is used to electrically isolate the powered circuit from the powering circuit. The PV devices are connected in series to provide a greater voltage than is provided by a single PV device. The propagation length (i.e., the width of the respective PV devices) is configured to provide equal current from the respective PV devices (e.g., by increasing the propagation length through PV devices farther from the light source in order to compensate for the attenuated light intensity resulting from the absorption occurring in closer PV devices to the light sources). The light propagates through the active regions of the PV devices and not through the conduction regions; therefore efficiency is improved by eliminating absorption of conventional PV devices in which light must first traverse a conduction region before entering the active region of the PV device. Any light source can be used as the light source, including LEDs, LDs, and VCSELs. The PV devices and light sources can be fabricated using any semiconductor including, for example, gallium arsenide (GaAs), aluminum gallium arsenide (AlGaAs), gallium phosphide (GaP), indium gallium phosphide (InGaP), gallium nitride (GaN), indium gallium arsenide (InGaAs), indium gallium arsenide nitride (GaInNAs), indium phosphide (InP), and gallium indium phosphide (GaInP). The PV devices and light sources can be heterojunction, double heterojunctions, or any other known type of semiconductor structure used to create light sources and/or PV devices. Between the light source and the PV devices, an index matching material can be used to minimize scattering loses. Further an anti-reflection coating can be used between the light source and the PV devices to reduce reflections and scattering losses. In one implementation, the source and the PV devices are fabricated as a monolithic structure on a single substrate. In one implementation, the light source and the PV devices are separated by etching between the structures (e.g., using a reactive ion etch or using a wet etch or a combination of dry and wet etches). In one implementation, the distance between the electrodes of the light source and the electrodes of the PV devices is made sufficiently large that capacitive coupling between the electrodes of the light source and the electrodes of the PV devices falls below a predefined threshold to preventive capacitive coupling and capacitive transmission of EMI between the powered circuit and the power circuit.

While certain implementations have been described, these implementations have been presented by way of example only, and are not intended to limit the teachings of this disclosure. Indeed, the novel methods, apparatuses and systems described herein may be embodied in a variety of other forms; furthermore, various omissions, substitutions and changes in the form of the methods, apparatuses and systems described herein may be made without departing from the spirit of this disclosure.

The invention claimed is:

1. An optical-power-transfer (OPT) apparatus, comprising:
   a first optical resonator;
   a first light source configured to convert electrical energy to light, the first light source including an active region arranged within the first optical resonator to overlap an optical mode of the first optical resonator; and
   a first photovoltaic device including an active region arranged within the first optical resonator to overlap the optical mode of the first optical resonator and configured to convert light to electrical energy, wherein
   the first optical resonator is configured to lase when a round-trip gain including gain from the active region of the first light source is greater than a round-trip loss including absorption by the active region of the first photovoltaic device.

2. The OPT apparatus according to claim 1, further comprising:
   a plurality of optical resonators including the first optical resonator;
   a plurality of light sources including the first light source, each of the light sources including an active region arranged to overlap an optical mode of the respective optical resonator of the plurality of optical resonators.

3. The OPT apparatus according to claim 2, further comprising:
   a plurality of photovoltaic devices electrically connected in series, each including an active region arranged to overlap the optical mode of the respective optical resonator of the plurality of optical resonators, wherein
   each of the plurality of photovoltaic devices is configured to generate a same current as each other of the photovoltaic device when light is generated by the plurality of light sources, and
   the plurality of photovoltaic devices include the first photovoltaic device.

4. The optical-power-transfer apparatus according to claim 3, wherein the plurality of light sources and the plurality of photovoltaic devices are a monolithic device.

5. The OPT apparatus according to claim 2, wherein each of the plurality of photovoltaic devices comprises
   a first conduction region,
   a second conduction region, and
   the active region, which is interposed between the first conduction region and the second conduction region and configured to convert light in the active region into the electrical energy, wherein
   the active region is arranged to receive the light from a corresponding light source of the plurality of light sources without the light first propagating through either the first conduction region or the second conduction region, and
   the first conduction region, the active region, and the second conduction region are arranged as a stack in first direction, which is orthogonal to a second direction in which the light propagates when in the optical mode of the respective optical resonator.

6. The OPT apparatus according to claim 5, wherein, when a first photovoltaic device of the plurality of photovoltaic devices is adjacent to a second photovoltaic device of the plurality of photovoltaic devices, the first conduction region of the first photovoltaic device, which is adjacent to the first conduction region of the second photovoltaic device, is doped to have a first conductivity type that is a different conductivity type than a conductivity type of the first conduction region of the second photovoltaic device, which is a second conductivity type.

7. The OPT apparatus according to claim 6, wherein, the first conductivity type corresponds to a p-type doping, the second conductivity type corresponds to a n-type doping, the first conduction region of the first photovoltaic device is a p-doped semiconductor region, and the first conduction region of the second photovoltaic device is an n-doped semiconductor region.

8. The OPT apparatus according to claim 5, wherein, when a first photovoltaic device of the plurality of photovoltaic devices is adjacent to a second photovoltaic device of the plurality of photovoltaic devices, the first conduction region of the first photovoltaic device, which is adjacent to the first conduction region of the second photovoltaic device, is doped to have a same conductivity type than a conductivity type of the first conduction region of the second photovoltaic device.

9. The OPT apparatus according to claim 2, wherein each of the plurality of optical resonators includes respective mirrors at boundaries of the respective optical resonator reflecting substantially all light in the cavity mode.

10. The OPT apparatus according to claim 2, wherein each of the plurality of optical resonators is a flat-flat resonator cavity.

11. The OPT apparatus according to claim 2, wherein, the plurality of optical resonators provide feedback one to another by coupling light from one of the plurality of optical resonators to another of the plurality of optical resonators.

12. The OPT apparatus according to claim 11, wherein, the plurality of optical resonators form a single optical cavity.

13. The OPT apparatus according to claim 2, wherein, each of the plurality of photovoltaic devices has a semiconductor region a first type of doping that is electrically connected to a semiconductor region of an adjacent photovoltaic device of the plurality of photovoltaic devices that is a second type of doping, wherein
the first type of doping of doping is a p-doping, when the second type of doping of doping is an n-doping, and
the first type of doping of doping is the n-doping, when the second type of doping of doping is the p-doping.

14. The OPT apparatus according to claim 1, wherein the first light source comprises one of gallium arsenide (GaAs), aluminum gallium arsenide (AlGaAs), gallium phosphide (GaP), indium gallium phosphide (InGaP), gallium nitride (GaN), indium gallium arsenide (InGaAs), indium gallium arsenide nitride (GainNAs), indium phosphide (InP), and gallium indium phosphide (GaInP).

15. The OPT apparatus according to claim 1, wherein the first photovoltaic device comprises one of gallium arsenide (GaAs), aluminum gallium arsenide (AlGaAs), gallium phosphide (GaP), indium gallium phosphide (InGaP), gallium nitride (GaN), indium gallium arsenide (InGaAs), indium gallium arsenide nitride (GaInNAs), indium phosphide (InP), and gallium indium phosphide (GaInP).

* * * * *